United States Patent
Kageyama et al.

(10) Patent No.: US 10,974,963 B2
(45) Date of Patent: Apr. 13, 2021

(54) ZIRCONIUM NITRIDE POWDER AND PRODUCTION METHOD THEREFOR

(71) Applicant: MITSUBISHI MATERIALS ELECTRONIC CHEMICALS CO., LTD., Akita (JP)

(72) Inventors: Kensuke Kageyama, Akita (JP); Takashi Konishi, Akita (JP)

(73) Assignee: MITSUBISHI MATERIALS ELECTRONIC CHEMICALS CO., LTD., Akita (JP)

(*) Notice: Subject to any disclaimer, the term of this patent is extended or adjusted under 35 U.S.C. 154(b) by 0 days.

(21) Appl. No.: 16/617,709

(22) PCT Filed: Mar. 7, 2018

(86) PCT No.: PCT/JP2018/008714
§ 371 (c)(1),
(2) Date: Nov. 27, 2019

(87) PCT Pub. No.: WO2018/225318
PCT Pub. Date: Dec. 13, 2018

(65) Prior Publication Data
US 2020/0156943 A1 May 21, 2020

(30) Foreign Application Priority Data
Jun. 9, 2017 (JP) .............................. JP2017-114111

(51) Int. Cl.
*C01B 21/076* (2006.01)
*G02F 1/1335* (2006.01)
*G03F 7/004* (2006.01)

(52) U.S. Cl.
CPC ...... *C01B 21/076* (2013.01); *G02F 1/133512* (2013.01); *G03F 7/0044* (2013.01); *C01P 2004/61* (2013.01); *C01P 2006/90* (2013.01)

(58) Field of Classification Search
None
See application file for complete search history.

(56) References Cited

U.S. PATENT DOCUMENTS 5,670,248 A * 9/1997 Lazarov ............... G02B 1/113
428/304.4

FOREIGN PATENT DOCUMENTS

JP 60-186407 9/1985
JP 04-006102 1/1992
(Continued)

OTHER PUBLICATIONS

Translation JP659194882; Apr. 13, 2020.*
(Continued)

*Primary Examiner* — Guinever S Gregorio
(74) *Attorney, Agent, or Firm* — Greenblum & Bernstein, P.L.C.

(57) ABSTRACT

The present invention provides a zirconium nitride powder comprising zirconium, nitrogen, and oxygen as main components, wherein the zirconium concentration is 73 to 82% by mass, the nitrogen concentration is 7 to 12% by mass, and the oxygen concentration is 15% by mass or less; in the transmission spectra of a dispersion having a powder concentration of 50 ppm, a light transmittance X at 370 nm is at least 12% and a light transmittance Y at 550 nm is 12% or less; and the ratio (X/Y) of the light transmittance X at 370 nm to the light transmittance Y at 550 nm is at least 1.4.

1 Claim, 1 Drawing Sheet

(56) References Cited

FOREIGN PATENT DOCUMENTS

| JP | 2008-266045 | 11/2008 |
|---|---|---|
| JP | 2009-091205 | 4/2009 |
| JP | 2017-222559 | 12/2017 |

OTHER PUBLICATIONS

International Preliminary Report on Patentability for International Patent Application No. PCT/JP2018/008714, dated Dec. 10, 2019; and English-language translation thereof.
Kobayashi, Hidehiko et al., "Synthesis and collection of Zrn fine powder from ZrO2 by Mg reduction", Journal of the Ceramic Society of Japan, 1991, pp. 508-513.
Ikeda, Tsutomu et al., "Preparation of Ultrafine Zirconium Nitride Powders from Zirconia by Reduction with Magnesium", Journal of the Ceramic Association, 1985, pp. 505-510.
Chau, J. L. H. et al., "Microwave plasma synthesis of TiN and ZrN nanopowders", Materials Letters, vol. 61, Aug. 22, 2006, pp. 1583-1587.
International Search Report issued in International Patent Application No. PCT/JP2018/008714, dated Apr. 10, 2018.
Written Opinion of the International Searching Authority issued in International Patent Application No. PCT/JP2018/008714, dated Apr. 10, 2018; and English-language translation thereof.
Office Action for CN App. No. 201880037835.0 dated Jun. 17, 2020.

\* cited by examiner

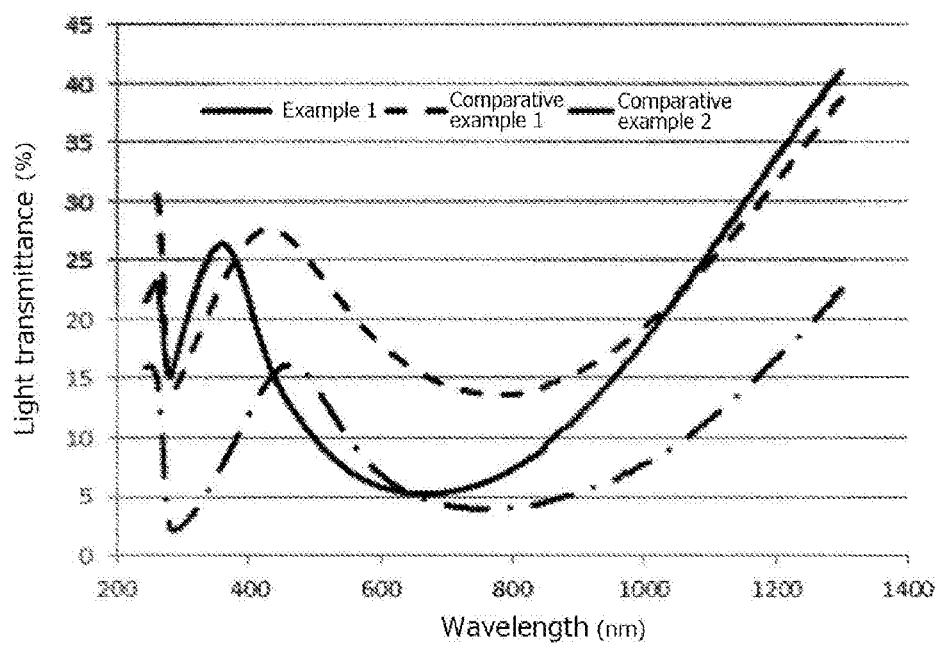

US 10,974,963 B2

ZIRCONIUM NITRIDE POWDER AND PRODUCTION METHOD THEREFOR

TECHNICAL FIELD

The present invention relates to a zirconium nitride powder suitably used as an insulating black pigment and a production method therefor. More specifically, it relates to a zirconium nitride powder which can form a patterning film with high resolution when forming a black patterning film as a black pigment and has high light shielding property of the formed patterning film and a production method therefor. This international application claims priority based on Japanese Patent Application No. 114111 (Japanese Patent Application No. 2017-114111) filed on Jun. 9, 2017, and the entire contents of Japanese Patent Application No. 2017-114111 are incorporated into this international application.

BACKGROUND ART

This type of black pigment is used for a black matrix of an image forming element such as a color filter of a liquid crystal display and the like, by dispersing in a photosensitive resin to prepare a black photosensitive composition, applying this composition to a substrate to form a photoresist film, and exposing the photoresist film by a photolithography method to form a patterning film. Since carbon black as a conventional black pigment has conductivity, it is not suitable for applications requiring insulation properties.

Conventionally, as a black pigment with high insulating property, there has been disclosed a high resistance black powder containing a black powder comprising titanium oxynitride which is also called as titanium black having a specific composition, and an insulating powder comprising at least one kind of $Y_2O_3$, $ZrO_2$, $SiO_2$, $TiO_2$ and $V_2O_5$ (for example, see Patent Document 1.). According to this black powder, it is said to be suitable as a black matrix of a color filter since it has a high resistance value and is excellent in light shielding property when it is formed into a black film.

Further, there is disclosed a fine particle lower zirconium oxide-zirconium nitride composite as an insulating black pigment containing zirconium nitride, characterized by having a peak corresponding to lower zirconium oxide and a peak corresponding to zirconium nitride in the X-ray diffraction profile, and having a specific surface area of 10 to 60 $m^2/g$ (for example, see Patent Document 2.). This fine particle lower zirconium oxide-zirconium nitride composite is produced by the process of firing a mixture of zirconium dioxide or zirconium hydroxide, magnesium oxide, and metallic magnesium at 650 to 800° C. in a nitrogen gas or an inert gas stream containing a nitrogen gas. The above-mentioned fine particle lower zirconium oxide-zirconium nitride composite can be used in a black system as a fine particle material having low electrical conductivity and it is said that it can be used as a fine particle black pigment having lower electrical conductivity of a black matrix for a display such as a television, etc., in which carbon black, etc., has been used, and according to the above-mentioned producing method, it can be said that the above-mentioned fine particle lower zirconium oxide-zirconium nitride composite is (mass) produced on an industrial scale.

PRIOR ART DOCUMENTS

Patent Documents

Patent Document 1: JP 2008-266045A (claim 1, paragraph [0002], paragraph [0010])

Patent Document 2: JP 2009-091205A (claim 1, claim 2, paragraph [0015], paragraph [0016])

SUMMARY OF THE INVENTION

Problems to be Solved by the Invention

However, the black powder called as titanium black shown in Patent Document 1, and the fine particle lower zirconium oxide-zirconium nitride composite shown in Patent Document 2 involved the problem that when they are used as a black pigment, in order to obtain higher light shielding property, at the time of forming a black patterning film by increasing a pigment concentration to prepare a black photosensitive composition, applying the composition onto a substrate to form a photoresist film and exposing the photoresist film by a photolithography method, the black pigment in the photoresist film also shields an i line (wavelength: 365 nm) which is a ultraviolet ray, so that the ultraviolet ray does not reach the bottom portion of the photoresist film to cause an undercut at the bottom portion whereby a patterning film with high resolution cannot be formed.

An object of the present invention is to provide zirconium nitride powder which can form a patterning film having high resolution when a black patterning film is formed as a black pigment and the formed patterning film has high light shielding property and a production method therefor.

Means to Solve the Problems

A first aspect of the present invention is a zirconium nitride powder comprising zirconium, nitrogen and oxygen as main components, a zirconium concentration of 73 to 82% by mass, a nitrogen concentration of 7 to 12% by mass and an oxygen concentration of 15 or less, in the transmission spectrum of a dispersion having a powder concentration of 50 ppm, a light transmittance X at 370 nm is at least 12% and a light transmittance Y at 550 nm is 12% or less, and a ratio (X/Y) of the light transmittance X at 370 nm to the light transmittance Y at 550 nm is 1.4 or more.

A second aspect of the present invention is a production method of the zirconium nitride powder of the first aspect, which comprises mixing zirconium dioxide powder, metallic magnesium powder and magnesium oxide powder so that the metallic magnesium becomes a ratio of 2.0 to 6.0-fold mol to the zirconium oxide powder, firing the mixture under an atmosphere of a mixed gas of a nitrogen gas and an inert gas or under a nitrogen gas atmosphere at a temperature of 650 to 900° C., or firing under an inert gas atmosphere followed by an atmosphere of a nitrogen gas alone each at a temperature of 650 to 900° C. to reduce the zirconium dioxide powder to produce zirconium nitride powder.

A third aspect of the present invention is a production method of zirconium nitride powder which comprises disposing a metal zirconium material having an average particle diameter of 30 μm or less on an anode of a plasma power source under a mixed gas atmosphere of argon and nitrogen or under a nitrogen gas atmosphere, applying a mixed plasma of argon and nitrogen from a cathode ray tube of the plasma power source to the metal zirconium material to generate zirconium nanoparticle vapor, and recovering the nanoparticle to produce a zirconium nitride powder.

A fourth aspect of the present invention is a black photosensitive composition containing the zirconium nitride powder which is the first aspect or the zirconium nitride powder produced by the second or the third aspect as a black pigment.

A fifth aspect of the present invention is a method for forming a black patterning film using the black photosensitive composition of the fourth aspect.

Effects of the Invention

The zirconium nitride powder of the first aspect of the present invention has a zirconium concentration of 73 to 82% by mass, a nitrogen concentration of 7 to 12% by mass and an oxygen concentration of 15% by mass or less, so that when a patterning film is formed by the powder, the light shielding property of the patterning film is not lowered. In addition, in the transmission spectrum of a dispersion having a powder concentration of 50 ppm, it has the characteristics that a light transmittance X at 370 nm is at least 12% and a light transmittance Y a 550 nm is 12% or lower, and has the characteristic that a ratio (X/Y) of the light transmittance X at 370 nm to the light transmittance Y at 550 nm is 1.4 or more. By being the ratio (X/Y) of 1.4 or more, it has the characteristic feature of further transmitting ultraviolet rays. As a result, when a black patterning film is formed as a black pigment, a patterning film with high resolution can be formed, and the formed patterning film becomes to have high light shielding property.

In the production method of the zirconium nitride powder which is the second aspect of the present invention, by firing under an atmosphere of a mixed gas of a nitrogen gas and an inert gas or under a nitrogen gas atmosphere, or an inert gas atmosphere followed by an atmosphere of a nitrogen gas alone, the reduction reaction is more promoted and the reaction efficiency is more heightened, whereby the zirconium nitride powder alone can be produced with a less amount of the metallic magnesium.

In the production method of the zirconium nitride powder which is the third aspect of the present invention, a mixed plasma (−) of argon and nitrogen is applied to a metal zirconium material (+) having an average particle diameter of 30 μm or less to generate zirconium nanoparticle vapor, and the nanoparticles are recovered, whereby there is an excellent effect that fine and high purity zirconium nitride can be obtained.

According to the black photosensitive composition which is the fourth aspect of the present invention, it is the zirconium nitride powder alone as the black pigment, so that when a black patterning film is formed by using the composition, a patterning film with high resolution can be formed, and the formed patterning film becomes to have high light shielding property.

According to the forming method of the black patterning film which is the fifth aspect of the present invention, a patterning film with high resolution can be formed, and the formed patterning film becomes to have high light shielding property.

BRIEF DESCRIPTION OF THE DRAWING

FIG. 1 is a spectral curve showing light transmittance in a dispersion obtained by diluting a dispersion of zirconium nitride powder obtained in Example 1 of the present invention and in Comparative Examples 1 and 2 to a powder concentration of 50 ppm.

EMBODIMENTS TO CARRY OUT THE INVENTION

Next, embodiments to carry out the present invention will be explained.

First Embodiment

[Method for Producing ZrN by firing using $ZrO_2$, Metal Mg and MgO as Raw Materials]

The first embodiment of the present invention is directed to a method for producing zirconium nitride (ZrN) powder in which zirconium, nitrogen and oxygen are in specific concentration ranges, which comprises using each powder of zirconium dioxide ($ZrO_2$), metallic magnesium (metal Mg) and magnesium oxide (MgO) as raw materials, and by firing under a specific atmosphere, and a specific temperature and time.

[Zirconium Dioxide Powder]

As the zirconium dioxide powder of the present embodiment, for example, any of the powders of the zirconium dioxide such as monoclinic zirconium dioxide, cubic zirconium dioxide, yttrium stabilized zirconium dioxide or the like can be used, and from the viewpoint of increasing the production rate of the zirconium nitride powder, monoclinic zirconium dioxide powder is preferred.

[Metallic Magnesium Powder]

If the particle diameter of the metallic magnesium powder is too small, the reaction proceeds rapidly and the risk of operation becomes high, so that it is preferable that the material has the particle diameter of 100 to 1,000 μm in a mesh pass of a sieve and in a granular state, and particularly preferably the material having 200 to 500 μm in a granular state. Provided that even if all the metallic magnesium is not within the above-mentioned range of the particle diameter, it may be sufficient if 80% by mass or more, in particular, 90% by mass or more thereof is within the above-mentioned range.

An amount of the metallic magnesium powder to be added to that of the zirconium dioxide powder affects the reducing power of the zirconium dioxide. If the amount, of the metallic magnesium is too small, it is difficult to obtain the intended zirconium nitride powder due to insufficient reduction, while if it is too much, the reaction temperature rapidly rises due to excessive metallic magnesium and there is a fear of causing grain growth of the powder which will become uneconomical. In the metallic magnesium powder, depending on the size of the particle diameter, the metallic magnesium powder is so added to the zirconium dioxide powder that the metallic magnesium becomes the ratio of 2.0 to 6.0-fold mol of that of the zirconium dioxide and mixed. If it is less than 2.0-fold mol, the reducing power of the zirconium dioxide is insufficient, while if it exceeds 6.0-fold mol, the reaction temperature rapidly rises due to excessive metallic magnesium, and there is a possibility of causing grain growth of the powder and it becomes uneconomical. It is preferably 3.0 to 5.0-fold mol.

[Magnesium Oxide Powder]

The magnesium oxide powder relaxes the reducing power of the metallic magnesium at the time of firing, and prevents sintering and grain growth of the zirconium nitride powder. The magnesium oxide powder is so added, depending on the size of the particle diameter thereof, to zirconium dioxide that the magnesium oxide becomes the ratio of 0.3 to 3.0-fold mol of that of the zirconium dioxide and mixed. If it is less than 0.3-fold mol, sintering of the zirconium nitride powder will not be prevented, while if it exceeds 3.0-fold mol, there is inconvenience that the amount of the acidic solution used required at the time of acid washing after firing increases. It is preferably 0.4 to 2.0-fold mol. The magnesium oxide powder preferably has an average primary particle diameter of 1,000 nm or less in terms of a spherical shape from the measured value of the specific surface area, and is more preferably 500 nm or less and 10 nm or more as the average primary particle diameter from the viewpoint of easiness in handling of the powder. It should be noted that not only magnesium oxide but also magnesium nitride is effective for preventing sintering of zirconium nitride, so it is possible to partially use magnesium nitride mixing with magnesium oxide.

[Reduction Reaction by Metallic Magnesium Powder]

A temperature at the time of reduction reaction by metallic magnesium for generating the zirconium nitride powder of the present embodiment is 650 to 900° C., and preferably 700 to 800° C. 650° C. is the melting temperature of metallic magnesium, and if the temperature is lower than that, the reduction reaction of zirconium dioxide does not occur sufficiently. In addition, even if the temperature is made higher than 900° C., it is not preferable since its effect does not increase, heat energy is lost and sintering of particles proceeds. Also, a time of reduction reaction is preferably 10 to 90 minutes, and more preferably 15 to 60 minutes.

A reaction vessel for carrying out the above-mentioned reduction reaction is preferably one having a lid so that raw materials and products are not scattered during the reaction. This is because, when the melting of metallic magnesium is started, the reduction reaction rapidly proceeds, the temperature rises accompanied thereby, the gas inside the vessel expands, and accordingly, there is a fear that the material inside of the vessel scatters to the outside.

[Atmospheric Gas at Reduction Reaction with Metallic Magnesium Powder]

The atmospheric gas at the time of the above-mentioned reduction reaction of the present embodiment is a mixed gas of a nitrogen gas and an inert gas or a nitrogen gas alone. As the inert gas, there may be mentioned argon, helium, neon, krypton, xenon, etc. Among these, argon is most preferable. In the case of a mixed gas, during the above-mentioned reduction reaction, a nitrogen gas and an inert gas may be used in combination, or may be firstly subjected to reduction reaction in an inert gas atmosphere followed by subjected to reduction reaction in an atmosphere of a nitrogen gas alone. The above-mentioned reduction reaction is carried out in the stream of the above-mentioned mixed gas. This mixed gas has a role of preventing contact between the metallic magnesium or a reduction product and oxygen, whereby preventing their oxidation, and reacting nitrogen with zirconium to generate zirconium nitride.

[Treatment of Reactant After Firing]

The reactant obtained by firing the mixture of the zirconium dioxide powder, the metallic magnesium powder and the magnesium oxide powder under the atmosphere of the above-mentioned mixed gas or under a nitrogen gas atmosphere, or an inert gas atmosphere followed by an atmosphere of a nitrogen gas alone is taken out from the reaction vessel, and, finally, after cooling to room temperature, washed with an acid solution such as an aqueous hydrochloric acid solution and the like to remove magnesium oxide generated by oxidation of the metallic magnesium or magnesium oxide contained from the beginning of the reaction for preventing sintering of the product. With regard to the acid washing, it is preferable to carry out at a pH of 0.5 or more, particularly at a pH of 1.0 or more, and a temperature of 90° C. or lower. This is because there is a fear of oxidizing zirconium nitride if the acidity is too strong or the temperature is too high. Then, after the acid washing, after adjusting the pH to 5 to 6 with aqueous ammonia or the like, the solid component is separated by filtration or centrifugal separation, and after drying the solid component, it is pulverized to obtain a zirconium nitride powder.

Second Embodiment

[Method for Producing ZrN by Nanoparticle Plasma Synthetic Method from Metal Zr as Raw Material]

The second embodiment of the present invention is a production of zirconium nitride nanoparticle by a high-frequency thermal plasma method. The thermal plasma apparatus comprises a raw material (mainly metal powder) feeding device, a high-frequency power source, a plasma torch, a chamber under a reaction gas (a nitrogen gas in the present invention) atmosphere and a bag filter for a product, and the raw materials are put into a plasma flame from the raw material feeding device by a carrier gas and gasifies by a high temperature of several thousand degrees. They are instantly cooled and condensed by a cooling gas introduced from a lower portion of the torch to obtain uniform and high purity nanoparticle. The present method has become common as a method for obtaining metal nanoparticles, metal oxides and metal nitride nanoparticles, but at present, it has not yet been established as a means for obtaining zirconium nitride with high nitridation degree and high purity. However, in the present invention, the particle diameter of metal zirconium which is a raw material is focused, and it has been found that high purity zirconium nitride particles can be obtained by using metal zirconium having an average particle diameter of 30 μm or less. On the other hand, if the particle diameter of zirconium powder which is a raw material exceeds 30 μm, dissolution and gasification are insufficient, and metal zirconium particles that are not nitrided are recovered so that zirconium nitride particles which exhibit sufficient characteristics cannot be obtained.

<Characteristics of Zirconium Nitride Powder Obtained by First and Second Embodiments>

The zirconium nitride powders obtained by the first and second embodiments comprise zirconium, nitrogen and oxygen as main components, and a zirconium concentration of 73 to 82% by mass, a nitrogen concentration of 7 to 12% by mass and an oxygen concentration of 15% by mass or less. If the zirconium concentration is less than 73% by mass, a ratio of the oxide is large, and when a patterning film is formed by the powder, light shielding property of the patterning film at the visible light region is lowered. Also, if the zirconium concentration exceeds 82% by mass, the metallic component remains so that light shielding property is lowered and it is likely oxidized at normal temperature whereby handling thereof becomes difficult. A preferable zirconium concentration is 74 to 80% by mass. Also, if the nitrogen concentration is less than 7% by mass, blackness is insufficient, so that when a patterning film is formed by the powder, light shielding property of the patterning film is lowered. Further, if the nitrogen concentration exceeds 12% by mass, it causes inconvenience that it is easily oxidized at normal temperature. A preferable nitrogen concentration is 8 to 11% by mass. Further, if the oxygen concentration exceeds 15% by mass, a coloring power is little, and when a patterning film is formed by the powder, light shielding property of the patterning film is lowered. A preferable oxygen concentration is 13% by mass or less.

Also, the zirconium nitride powder obtained by the first and second embodiments preferably has a specific surface area measured by a BET value of 15 to 70 m$^2$/g. If the above-mentioned specific surface area of the zirconium nitride powder is less than 15 m$^2$/g, when it is made a black resist, a pigment is likely sedimented during a long term storage, while if it exceeds 70 m$^2$/g, when a patterning film is formed as a black pigment, light shielding property is likely insufficient. It is more preferably 20 to 65 m$^2$/g. An average particle diameter regarded as spherical can be calculated from the above-mentioned specific surface area value by the following equation (1). The average particle diameter calculated from the BET specific surface area value is preferably 10 to 50 nm. In the equation (1), L is an average particle diameter (μm), ρ is a density of the powder (g/cm$^3$) and S is a specific surface area value (m$^2$/g) of the powder.

$$L=6/(\rho \times S) \tag{1}$$

The zirconium nitride powder has, in the transmission spectrum of a dispersion having a powder concentration of 50 ppm, a light transmittance X at 370 nm is at least 12%, that is, 12% or more, and a light transmittance Y at 550 nm is 12% or less. If the light transmittance X is less than 12%, when the patterning film is to be formed as a black pigment, the bottom portion of the photoresist film is not exposed, and undercut of the patterning film occurs. Also, if the light transmittance Y exceeds 12%, light shielding property of the formed patterning film is insufficient and a high OD value cannot be obtained. Preferable light transmittance X is 14% or more, and preferable transmittance Y is 8% or less. Taking into account the trade-off characteristics of the above-mentioned light transmittance X and the light transmittance Y, the zirconium nitride powder of the present embodiment has a ratio (X/Y) of the light transmittance X at 370 nm to the light transmittance Y at 550 nm of 1.4 or more, and preferably 2.0 or more. That is, by being X/Y of 1.4 or more, there is an effect of ultraviolet ray transmission, and priority is given to not causing undercut of the patterning film.

[Forming Method of Patterning Film Using Zirconium Nitride Powder as Black Pigment]

A forming method of a patterning film represented by black matrix using the above-mentioned zirconium nitride powder as a black pigment will be described. First, the above-mentioned zirconium nitride powder is dispersed in a photosensitive resin to prepare a black photosensitive composition. Then, the black photo-sensitive composition is coated onto a substrate, and then, prebaking is carried out to evaporate the solvent to form a photoresist film. Next, the photoresist film is exposed to a prescribed pattern shape through a photomask, then, developed with an alkali developing solution to dissolve and remove the unexposed portion of the photoresist film, thereafter post-baking is preferably carried out whereby a predetermined black patterning film is formed.

As an index representing a light shielding property (attenuation of transmittance) of the formed patterning film, an optical density, i.e., an OD (Optical Density) value has been known. The patterning film formed by using the zirconium nitride powder of the present embodiment has a high OD value. Here, the OD value is a logarithmic representation of the degree of absorption of light as it passes through the patterning film, and is defined by the following equation (2). In the equation (2), I is a transmitted light quantity, and $I_0$ is an incident light quantity.

$$\text{OD value}=-\log_{10}(I/I_0) \tag{2}$$

As the above-mentioned substrate, for example, there may be mentioned glass, silicon, polycarbonate, polyester, aromatic polyamide, polyamideimide, polyimide, and the like. In addition, to the above-mentioned substrate, if desired, an appropriate pretreatment such as chemical treatment with a silane coupling agent, and the like, plasma treatment, ion plating, sputtering, gas phase reaction method, vacuum vapor deposition or the like may be optionally applied. When the black photosensitive composition is to be applied to a substrate, an appropriate coating method such as spin coating, cast coating, roll coating or the like can be adopted. A thickness of the coating is, as thickness after drying, in general, 0.1 to 10 μm, preferably 0.2 to 7.0 μm, more preferably 0.5 to 6.0 μm. As the radiation used when the patterning film is formed, in the present embodiment, radiation having a wavelength in the range of 250 to 370 nm is preferable. An irradiation energy quantity of the radiation is preferably 10 to 10,000 J/m$^2$. Also, as the above-mentioned alkali developing solution, for example, an aqueous solution of sodium carbonate, sodium hydroxide, potassium hydroxide, tetramethylammonium hydroxide, choline, 1,8-diazabicyclo-[5.4.0]-7-undecene, 1,5-diazabicyclo-[4.3.0]-5-nonene, and the like are preferable. To the above-mentioned alkali developing solution, for example, a suitable amount of a water-soluble organic solvent such as methanol, ethanol or the like, or a surfactant or the like may be added. Incidentally, after alkali development, it is usually washed with water. As the developing treatment method, a shower development method, a spray development method, a dipping (immersion) development method, a muddle (liquid filling) development method and the like can be applied, and the development condition is preferably for 5 to 300 seconds at normal temperature. The patterning film thus formed can be suitably used for a high precision liquid crystal, a black matrix material for organic EL, a light shielding material for an image sensor, a light shielding material for an optical material, a light shielding filter, an IR cut filter, and the like.

EXAMPLES

Next, Examples of the present invention will be explained in detail together with Comparative Examples.

Example 1

To 7.4 g of a monoclinic zirconium dioxide powder having an average primary particle diameter calculated from the specific surface area measured by the BET method of 50 nm were added 7.3 g of metallic magnesium powder having an average primary particle diameter of 100 μm and 3.6 g of a magnesium oxide powder having an average primary particle diameter of 20 nm, and uniformly mixed by a reaction apparatus in which a graphite boat has been internally mounted in a glass tube made of quartz. At this time, an amount of the metallic magnesium added was 5.0-fold mol of that of the zirconium dioxide, and an amount of the magnesium oxide to be added was 1.5-fold mol of that of the zirconium dioxide. The reaction gas was made a mixed gas of a nitrogen gas and an argon gas, and an atmosphere was made a mixed gas in which a ratio (N$_2$:Ar) in volume % thereof is 90%:10%. The above-mentioned mixture was calcined under an atmosphere of the mixed gas at a temperature of 700° C. for 60 minutes to obtain a calcined product. This calcined product was dispersed in 1 liter of water, 5% hydrochloric acid was gradually added thereto to carry out washing at a pH of 1 or more while maintaining a temperature to 100° C. or lower followed by adjusting a pH to 7 to 8 with 25% aqueous ammonia, and the mixture was filtered. The filtered solid content was redispersed in water with 400 g/liter, and once again, subjected to acid washing, pH adjustment with aqueous ammonia and filtered once again in the same manner as mentioned above. Thus, after repeating acid washing-pH adjustment by aqueous ammonia twice, the filtrate was dispersed in ion exchange water with 500 g/liter in terms of the solid content, and after subjecting to stirring under heating at 60° C. and adjustment of a pH to 7, the mixture was filtered by a suction filtration apparatus, further washed with an equal amount of ion exchange water, and dried in a hot air dryer at a set temperature of 120° C. to obtain a zirconium nitride powder.

Example 2

In the same manner as in Example 1 except that the same metallic magnesium powder as in Example 1 was changed to 2.0 g (2.0-fold mol of zirconium dioxide), the reaction temperature was 900° C. and the volume ratio of nitrogen and argon was 5%:95%, a zirconium nitride powder was produced.

Example 3

The same metallic magnesium powder as in Example 1 was changed to 5.8 g (4.0-fold mol of zirconium dioxide), and magnesium nitride was added in place of magnesium oxide in an amount of 2.0-fold mol of zirconium oxide. The reaction gas was made 100% nitrogen, the reaction temperature was 650° C. and the reaction time was 30 minutes. A zirconium nitride powder was produced in the same manner as in Example 1 except for the above.

Example 4

The reaction gas atmosphere was subjected to reduction reaction firstly under an argon gas atmosphere (Ar:100%) followed by reduction reaction under a nitrogen gas atmosphere ($N_2$:100%) for 30 minutes. A zirconium nitride powder was produced in the same manner as in Example 1 except for the above.

Example 5

A metal zirconium powder (purity 99%, average particle diameter 30 μm) as a raw material was put into a high-frequency induction thermal plasma nanoparticle synthetic apparatus (TP40020NPS manufactured by JEOL Ltd.), the raw material was volatilized by a mixed plasma (gas ratio 50:50) of argon and nitrogen, nitrogen was used as a quenching gas and the product was recovered in the lower chamber of the apparatus to obtain zirconium nitride nanopowder.

Comparative Example 1

By the method in accordance with the method shown in Example 1 of Patent Document 2, fine particle lower zirconium oxide-zirconium nitride composite was obtained. That is, 7.2 g of zirconium dioxide powder having an average primary particle diameter of 19 nm and 3.3 g of fire particle magnesium oxide having an average primary particle diameter of 20 nm were mixed and pulverized to obtain a mixed powder A. To 0.5 g of the mixed powder was added 2.1 g of metallic magnesium powder having an average primary particle diameter of 150 μm and mixed to obtain a mixed powder B. At this time, added amounts of the metallic magnesium and the magnesium oxide were 1.4-fold mol and 1.4-fold mol of the zirconium dioxide, respectively. This mixed powder B was calcined under an atmosphere of a nitrogen gas at a temperature of 700° C. for 60 minutes. Thereafter, in the same manner as in Example 1, a fine particle lower zirconium oxide-zirconium nitride composite was obtained.

Comparative Examples 2

A black powder of titanium black shown in Example 1 of Patent Document 1 was prepared. That is, a titanium oxide powder having an average primary particle diameter of 160 nm was calcined under an atmosphere of an ammonia gas at a temperature of 850° C. for 180 minutes to obtain 70 nm of titanium oxynitride ($TiO_{0.3}N_{0.9}$), and then, titanium oxynitride and an insulating powder comprising $Al_2O_3$ having an average primary particle diameter of 10 nm were added to 100 parts by mass of titanium oxynitride in amounts of 5.0 parts by mass and mixed to produce a black powder.

Comparative Examples 3

A zirconium nitride powder was produced in the same conditions as in Example 1 except for changing the reaction temperature to 600° C.

Comparative Examples 4

The same metallic magnesium powder as in Example 1 was changed to 1.5 g (1.5-fold mol of zirconium dioxide)) and the reaction gas was changed to 100% nitrogen. A zirconium nitride powder was produced in the same manner as in Example 1 except for the above.

Comparative Examples 5

In the same conditions as in Example 1 except that the reaction gas was changed to a mixed gas of nitrogen, argon and oxygen (volume ratio 88%:10%:2%), a zirconium nitride powder was produced.

Comparative Examples 6

In the same conditions as in Example 5 except that an average particle diameter of the metal zirconium powder as the raw material was changed to 40 μm, a zirconium nitride powder was produced by plasma synthesis.

Each production method of Examples 1 to 5 and Comparative Examples 1 to 6, molar ratio of zirconium dioxide to the added amounts of metallic magnesium and magnesium nitride or magnesium oxide (hereinafter referred to as Mg source.), a kind and a ratio of the additive(s), a kind of the reaction gas which is an atmospheric gas and a ratio of the vol % thereof, a firing temperature and a firing time are shown in Table 1.

TABLE 1

| | Producing method | Metallic Mg/ZrO$_2$ (molar ratio) | Mg$_3$N$_2$/ ZrO$_2$ (molar ratio) | MgO/ZrO$_2$ (molar ratio) | Production conditions | | | |
|---|---|---|---|---|---|---|---|---|
| | | | | | First reaction gas atmosphere (vol % ratio) | Second reaction gas atmosphere (vol % ratio) | Calcination temperature (° C.) | Calcination time (min) |
| Example 1 | Reduction by Mg | 5.0 | — | 1.5 | N$_2$ + Ar = 90%:10% | N$_2$ + Ar = 90%:10% | 700 | 60 |
| Example 2 | Reduction by Mg | 2.0 | — | 1.5 | N$_2$ + Ar = 5%:95% | N$_2$ + Ar = 5%:95% | 900 | 60 |
| Example 3 | Reduction by Mg | 4.0 | 2.0 | — | N$_2$ = 100% | N$_2$ = 100% | 650 | 30 |
| Example 4 | Reduction by Mg | 5.0 | — | 1.5 | Ar = 100% | N$_2$ = 100% | 700 | 60 |
| Example 5 | Plasma synthesis | — | — | — | N$_2$ + Ar = 50%:50% | N$_2$ = 100% | — | — |
| Comparative Example 1 | Reduction by Mg | 1.4 | — | 1.4 | N$_2$ = 100% | N$_2$ = 100% | 700 | 60 |
| Comparative Example 2 | Titanium black | — | — | — | NH$_3$ = 100% | NH$_3$ = 100% | — | — |
| Comparative Example 3 | Reduction by Mg | 5.0 | — | 1.5 | N$_2$ + Ar = 90%:10% | N$_2$ + Ar = 90%:10% | 600 | 60 |
| Comparative Example 4 | Reduction by Mg | 1.5 | — | 1.5 | N$_2$ = 100% | N$_2$ = 100% | 700 | 60 |
| Comparative Example 5 | Reduction by Mg | 5.0 | — | 1.5 | N$_2$ + Ar + O$_2$ = 88%:10%:2% | N$_2$ + Ar + O$_2$ = 88%:10%:2% | 700 | 60 |
| Comparative Example 6 | Plasma synthesis | — | — | — | N$_2$ + Ar = 50%:50% | N$_2$ = 100% | — | — |

<Comparative Test and Evaluation 1>

The zirconium nitride powders obtained in Examples 1 to 5 and Comparative Examples 3 to 6, the fine particle lower zirconium oxide-zirconium nitride composite obtained in Comparative Example 1, and the black powder prepared in Comparative Examples 2 were each used as a sample, and by the methods mentioned in detail hereinbelow, (1) an average particle diameter, (2) each concentration of zirconium, nitrogen and oxygen, (3) a spectral curve of the dispersion with a powder concentration of 50 ppm, (4) a light transmittance X at 370 nm and a light transmittance Y at 550 nm, and (5) X/Y were measured or calculated. The respective measurement results or calculated results are shown in Table 2. In Table 2, "TiB" means titanium black. In addition, for all the samples, (6) an X-ray diffraction profile was measured. The measured results are shown in Table 3. In Table 3, "Zr$_2$N$_2$O" means lower zirconium oxynitride.

(1) Average particle diameter: With regard to all the samples, by using a specific surface area measurement apparatus (SA-1100, manufactured by SIBATA SCIENTIFIC TECHNOLOGIES, LTD.), a specific surface area value was measured according to the single point BET method by nitrogen adsorption. From these specific surface area values, the average particle diameter in which each sample was regarded as spherical was calculated according to the above-mentioned equation (1).

(2) Each concentration of zirconium, nitrogen and oxygen. The zirconium concentration was measured by using an inductively coupled plasma emission spectrometer (iCAP6500Duo manufactured by Thermo Fisher Scientific). The nitrogen concentration and the oxygen concentration were measured by using an oxygen-nitrogen analytical apparatus (ON736 manufactured by LECO JAPAN CORPORATION).

(3) Spectral curve of dispersion with powder concentration of 50 ppm: With respect to each of the samples of Examples 1 to 5 and Comparative Examples 1 to 6, these samples were separately placed in a circulating horizontal type bead mill (media: zirconia), and an amine-based dispersing agent was added to carry out dispersing treatment in a propylene glycol monomethyl ether acetate (PGM-AC) solvent. The obtained eleven kinds of the dispersions were diluted 100,000-fold and a powder concentration was adjusted to 50 ppm. The light transmittance of each sample of the diluted dispersion was measured in the wavelength range from 240 nm to 1,300 nm using UH-4150 manufactured by Hitachi High-Tech Fielding Corporation, and each of the light transmittance (%) at the wavelength of 370 nm near the i-line (365 urn) and at the wavelength of 550 nm was measured. In FIG. 1, three spectral curves of Example 1 and Comparative Examples 1 and 2 are shown.

(4) Light transmittance X at 370 nm and light transmittance Y at 550 nm: The respective light transmittances X and Y were read from the spectral curves of each of the samples of Examples 1 to 5 and Comparative Examples 1 to 6.

(5) X/Y: X/Y was calculated from the light transmittance X and the light transmittance Y read from the spectral curves of each of the samples of Examples 1 to 5 and Comparative Examples 1 to 6.

(6) X-ray diffraction profile: With regard to the samples of Examples 1 to 5 and Comparative Examples 1 to 6, X-ray diffraction analysis was carried out from the X-ray diffraction profile by the θ-2θ method using an X-ray diffractometer (Model No.: Miniflex II manufactured by Rigaku Corporation) under the conditions of an applied voltage of 45 kV and an applied current of 40 mA using CuKα ray. From the X-ray diffraction profile, the presence or absence of a peak (2θ=33.95°, 39.3°) of zirconium nitride, a peak (2θ=30.2°) corresponding to zirconium dioxide, a peak corresponding to lower zirconium oxide, a peak (2θ=30.5°, 35.3°) corresponding to lower zirconium oxynitride and a peak (2θ=35.6°) corresponding to zirconium metal were examined.

TABLE 2

| | Final product | | | | | Transmission spectrum of dispersion with powder concentration of 50 ppm | | |
|---|---|---|---|---|---|---|---|---|
| | | Average particle diameter | Composition analysis of final product | | | | Light transmittance X | Light transmittance Y | |
| | Kind | (nm) | Zr (mass %) | N (mass %) | O (mass %) | Total (mass %) | (370 nm) | (550 nm) | X/Y |
| Example 1 | ZrN | 43 | 76 | 10 | 11 | 97 | 26.0 | 7.3 | 3.56 |
| Example 2 | ZrN | 30 | 73 | 7 | 15 | 95 | 16.9 | 12.0 | 1.41 |
| Example 3 | ZrN | 45 | 77 | 8 | 13 | 98 | 16.0 | 8.0 | 2.00 |
| Example 4 | ZrN | 36 | 78 | 10 | 8 | 96 | 20.0 | 6.0 | 3.33 |
| Example 5 | ZrN | 30 | 82 | 12 | 6 | 100 | 12.0 | 6.0 | 2.00 |
| Comparative Example 1 | ZrOx + ZrN | 45 | 75 | 6 | 18 | 99 | 24.1 | 20.8 | 1.16 |
| Comparative Example 2 | TiB | 70 | — | 15 | 15 | — | 8.7 | 10.0 | 0.87 |
| Comparative Example 3 | ZrN | 40 | 72 | 7 | 18 | 97 | 30.0 | 14.0 | 2.14 |
| Comparative Example 4 | ZrN | 50 | 73 | 7 | 19 | 99 | 28.0 | 13.0 | 2.15 |
| Comparative Example 5 | ZrN | 45 | 70 | 3 | 25 | 98 | 24.0 | 18.0 | 1.33 |
| Comparative Example 6 | ZrN | 31 | 83 | 13 | 4 | 100 | 16.0 | 13.0 | 1.23 |

TABLE 3

| | Presence or absence of peak of X-ray diffraction profile | | | | OD value | |
|---|---|---|---|---|---|---|
| | Position corresponding to ZrN | Position corresponding to $ZrO_2$ | Position corresponding to $Zr_2N_2O$ | UV transmittance (370 nm) | Visible light shielding property (560 nm) | |
| Example 1 | Present | None | None | Excellent | Excellent |
| Example 2 | Present | None | None | Good | Good |
| Example 3 | Present | None | None | Good | Good |
| Example 4 | Present | None | None | Excellent | Excellent |
| Example 5 | Present | None | None | Good | Excellent |
| Comparative Example 1 | Present | None | Present | Excellent | Poor |
| Comparative Example 2 | None | None | None | Poor | Good |
| Comparative Example 3 | Present | None | Present | Excellent | Poor |
| Comparative Example 4 | Present | None | Present | Excellent | Poor |
| Comparative Example 5 | Present | Present | Present | Excellent | Poor |
| Comparative Example 6 | Present | None | None | Poor | Poor |

As is apparent from Table 2, the samples of Comparative Examples 1 and Comparative Examples 2 had the transmittance at 370 nm in the spectral transmission curve of 24.1% and 8.7%, respectively, and the transmittance at 550 nm of 20.8% and 10.0%, respectively. To the contrary, the transmittance at 370 nm in the spectral transmission curve of the sample of Example 1 was 26.0% which was higher than those of Comparative Examples 1 and 2, and the transmittance at 550 nm was 7.3% which was lower than those of Comparative Examples 1 and 2. In addition, with regard to the ratio (X/Y) of the light transmittance X at 370 nm to the light transmittance Y at 550 nm, as clearly seen from Table 2, Comparative Examples 1, 2, 5 and 6 did not satisfy the requirements of the present invention, so that all were less than 1.4. Whereas Comparative Examples 3 and 4 were 1.4 or more, the light transmittance at 550 nm was as high as 12% or more. To the contrary, Examples 1 to 5 satisfy the requirements of the present invention, so that the ratio (X/Y) of the light transmittance X at 370 nm to the light transmittance Y at 550 nm was all 1.4 or more. From the above results, it was found that the samples of Examples 1 to 5 are advantageous for patterning since they transmit ultraviolet rays in addition to have high light shielding performance of visible light.

As clearly seen from Table 3, the samples of Comparative Examples 1, 3, 4 and 5 had, in the X-ray diffraction profile, not only the peak (2θ=33.95°, 39.3°) of zirconium nitride but also the peak (2θ=30.5°, 35.3°) or lower zirconium oxynitride. The sample of Comparative Example 5 was admitted to further have the peak of zirconium oxide. The sample of Comparative Example 6 was admitted to have the peak (2θ=35.6°) of zirconium metal. To the contrary, the samples of Examples 1 to 5 and Comparative Examples 2 had the peak of zirconium nitride in the X-ray diffraction profile, but they had none of the peak of zirconium dioxide, the peak of lower zirconium oxide and the peak of lower zirconium oxynitride.

<Comparative Test and Evaluation 2>

An acrylic resin was added to the dispersion used for the measurement of the light transmittance of the samples obtained in Examples 1 to 5 and Comparative Examples 1 to 6 with a ratio of the black pigment: the resin=6:4 in a mass ratio, and mixed to prepare black photosensitive compositions. The composition was spin-coated onto a glass substrate so that the film thickness after firing became 1 μm, and calcined at a temperature of 250° C. for 60 minutes to form a film. The OD values of ultraviolet rays (center wavelength: 370 nm) and visible light (center wavelength: 560 nm) of the film were measured using a densitometer (densitometer) having the product name of D200 manufactured by Macbeth Co., based on the above-mentioned equation (2). The results are shown in Table 3. In Table 3, as a measure indicating the transmittance of ultraviolet rays, the OD value at 370 nm of ultraviolet rays (UV) of 2.5 or less is made "excellent", exceeding 2.5 and 3.0 or less is made "good" and the case exceeding 3.0 is made "poor". Also, as a measure indicating the light shielding property of visible light, the case where the OD value at 560 nm of visible light of exceeding 4.0 is made "excellent", 3.2 or more and 4.0 or less is made "good" and less than 3.2 is made "poor".

As is apparent from Table 3, with regard to the OD value as a measure showing transmittance of the ultraviolet rays and light shielding property of the visible light, the sample of Comparative Examples 1 was insufficient in reduction of zirconium dioxide so that the OD value at 560 nm of the visible light was low and thus it was "poor". Also, the titanium black sample of Comparative Example 2 was insufficient in ultraviolet rays transmission performance so that the OD value at 370 nm of UV was high and thus it was "poor".

Further, the samples of Comparative Examples 3 and 4 were insufficient in nitriding degree so that the OD value at 560 nm of the visible light was low and thus it was "poor". Also, in the sample of Comparative Example 5, zirconium oxide was contained so that the OD value at 560 nm of the visible light was low and thus it was "poor". In Comparative Example 6, metal zirconium was contained so that the OD value at 370 nm of UV was high and the OD value at 560 nm was low and thus it was "poor".

To the contrary, the samples of Examples 1 to 5 satisfied the requirements of the present invention so that the OD value at 370 nm of the ultraviolet rays (UV) were "excellent" or "good", and the OD value at 560 nm of the visible light were also "excellent" or "good". From the above results, it was found that the samples of Examples 1 to 5 are advantageous for patterning since they transmit ultraviolet rays in addition to have high light shielding performance of visible light.

UTILIZABILITY IN INDUSTRY

The zirconium nitride powder of the present invention can be utilized for a high precision liquid crystal, a black matrix material for organic EL, a light shielding material for an image sensor, a light shielding material for an optical element, a light shielding filter, an IR cut filter, and the like.

The invention claimed is:
1. A zirconium nitride powder comprising:
   zirconium, nitrogen, and oxygen as main components,
   a zirconium concentration of 73 to 82% by mass,
   a nitrogen concentration of 7 to 12% by mass, and
   an oxygen concentration of 15% by mass or less,
   wherein:
   in the transmission spectrum of a dispersion of the powder having a powder concentration of 50 ppm, a light transmittance X at 370 nm is at least 12% and a light transmittance Y at 550 nm is 12% or less, and a ratio (X/Y) of the light transmittance X at 370 nm to the light transmittance Y at 550 nm is 1.4 or more, and
   an average particle diameter of the powder calculated from a BET specific surface area value is 10 to 50 nm.

* * * * *